(12) United States Patent
Terashima et al.

(10) Patent No.: US 8,112,263 B2
(45) Date of Patent: Feb. 7, 2012

(54) METHOD FOR LOGIC CHECKING TO CHECK OPERATION OF CIRCUIT TO BE CONNECTED TO BUS

(75) Inventors: Yoshihiro Terashima, Kanagawa (JP); Hiroshi Nonoshita, Kanagawa (JP); Nobuyuki Yuasa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 211 days.

(21) Appl. No.: 12/432,394

(22) Filed: Apr. 29, 2009

(65) Prior Publication Data

US 2009/0210597 A1 Aug. 20, 2009

Related U.S. Application Data

(62) Division of application No. 10/291,508, filed on Nov. 12, 2002, now Pat. No. 7,548,841.

(30) Foreign Application Priority Data

Nov. 16, 2001 (JP) ................................ 2001-351707
Nov. 20, 2001 (JP) ................................ 2001-354744

(51) Int. Cl.
*G06F 17/50* (2006.01)
*G01R 31/00* (2006.01)

(52) U.S. Cl. ............................. 703/13; 703/14; 702/117

(58) Field of Classification Search .................... 703/13, 703/14; 702/117, 120; 714/39, 732, 736; 710/113
See application file for complete search history.

(56) References Cited

U.S. PATENT DOCUMENTS

| 5,493,672 | A | 2/1996 | Lau et al. | ........................ 703/21 |
| 6,123,735 | A | 9/2000 | Raghavan et al. | ............... 703/21 |
| 6,629,174 | B1 * | 9/2003 | Farkas et al. | ................... 710/113 |
| 6,678,625 | B1 | 1/2004 | Reise et al. | ..................... 702/117 |
| 6,757,847 | B1 * | 6/2004 | Farkash et al. | .................. 714/39 |
| 2005/0209839 | A1 | 9/2005 | Nightingale et al. | ........... 703/19 |

OTHER PUBLICATIONS

David Becker, Raj K. Singh, and Stephen G. Tell, An Engineering Environment for HW-SW Co-Simulation, 1992, Annual ACM IEEE Design Automation Conference archive, Proceedings of the 29th ACM/IEEE Design Automation Conference, ISBN:0-89791-516-X, pp. 129-134.*

* cited by examiner

*Primary Examiner* — Paul Rodriguez
*Assistant Examiner* — Juan Ochoa
(74) *Attorney, Agent, or Firm* — Fitzpatrick, Cella, Harper & Scinto

(57) ABSTRACT

To check operation of a circuit to be checked connected to a bus to which at least one master circuit and at least one slave circuit are connected, a model is connected to a bus in place of a master circuit or a slave circuit and cause given signals to be outputted at given timing for checking the operation of the circuit to be checked. Especially, by causing various data transfer to occur at random timing by a plurality of models, it is easy to cause severer than actual conditions to take place easily, enabling to enhance efficiency of checking. For example, when checking operation of a bus arbiter, a plurality of master models are connected in place of a plurality of master circuits to cause a request of bus accessibility to be outputted from each master model at random timing to check arbitration operation of a bus arbiter.

13 Claims, 22 Drawing Sheets

```
module test_with_master_model_and_dut;
  include "system_routines.vh"         // includes system_***_routine initial begin
    test_sequence_using_master_model;
  end // initial begin task test_sequence_using_master_model;
  begin
    system_initialize_routine;              // (step 1.1)
    dut_module_initialize_routine;          // (step 1.3)

mst_module_data_transmit_routine_by_model;  // (step 2.5)

dut_module_finalize_routine;            // (step 1.7)
    system_finalize_routine;                // (step 1.8)
  end
  endtask // test_sequence_using_pseudo_master_model task mst_module_data_transmit_routine_by_model;
    integer  i;
    reg [31:0] addr;
    reg [31:0] data;
    reg [31:0] burst_beat;
  begin
    burst_beat = 1;

for (i=0; i<4096; i=i+1) begin
      addr = 32'h4000_0000 + i;
      data = i;
      sys.master_model.write(addr, data, burst_beat);
    end // for (i=0; i<4096; i=i+1)

// enhanced part (e.g. all address area)
    for (i=4096; i<32'h2000_0000; i=i+1) begin
      addr = 32'h4000_0000 + i;
      data = i;
      sys.master_model.write(addr, data, burst_beat);
    end // for (i=0; i<4096; i=i+1)
  end
  endtask // module_data_transmit_routine_by_model task dut_module_initialize_routine;
  begin
    write_reg(32'h1008_0000, 32'h8000_0000);  // enable dut
    // and so on ...
  end
  endtask // dut_module_initialize_routine task dut_module_finalize_routine;
  begin
    write_reg(32'h1008_0000, 32'h0000_0000);  // disable dut
    // and so on ...
  end
  endtask // dut_module_finalize_routine endmodule // test_with_master_model_and_dut
```

FIG. 6

```
module master_model;

reg       fix_req; // force req always TRUE
    reg [31:0] gnt_to_str;
    reg [31:0] str_to_req;

reg [31:0] addr;
    reg [31:0] data;
    reg [31:0] burst_beat;
    reg       exec_trans; // activate and status flag for actual transaction task write;
        input [31:0] addr;
        input [31:0] data;
        input [31:0] burst_beat;
    begin
        $display("Execute transaction¥n");
        addr = addr;
        data = data;
        burst = burst_beat;

exec_trans = 1;
        wait (exec_trans == 0);
    end
    endtask // write task assert_req;
    begin
        $display("Set req signal TRUE. ¥n");
        fix_req = 1;
    end
    endtask // assert_req
    task deassert_req;
    begin
        $display("Set req signal FALSE. ¥n");
        fix_req = 0;
    end
    endtask // deassert_req task set_gnt_to_str;
        input [31:0] value;
    begin
        $display("Set detecting gnt to asserting str timing : %d¥n", value);
        gnt_to_str = value;
    end
    endtask // set_gnt_to_str task set_str_to_req;
        input [31:0] value;
    begin
        $display("Set asserting gnt to dasserting req timing : %d¥n", value);
        str_to_req = value;
    end
    endtask // set_gnt_to_req
    // actual bus functional sequences
    // (suppressed)

endmodule // master_model
```

FIG. 8

```
task mst_module_random_transmit_routine_by_model;
    reg [31:0] i;
    reg [31:0] addr;
    reg [31:0] data;
    reg [31:0] burst_type;
begin
    for (i=0; i<1024; i=i+1) begin
        addr = $random() && 32'h0000_ffff;
        data = $random();
        burst_type = $random() && 32'h0000_0002;
        sys. master_model. tx(addr, data, burst_type);
    end // for (i=0; i<1024; i=i+1)
end
endtask // mst_module_random_transmit_routine_by_model task mst_module_signal_timing_routine_by_model;
    reg [31:0] i;
    reg [31:0] j;
begin
    for (i=0; i<32; i=i+1) begin
        for (j=0; j<32; j=j+1) begin
            sys. master_model. set_gnt_to_str(i);
            sys. master_model. set_str_to_req(j);
            sys. master_model. tx(32'h4000_0000 + 1*32 + j, j, 0);
        end // for (j=0; j<32; j=j+1)
    end // for (i=0; i<32; i=i+1)
end
endtask // mst_module_signal_timing_routine_by_model
```

FIG. 9

```
module slave_model;

reg [31:0] response_mode;
    reg [31:0] burst_type;
    reg [31:0] wait_cycle;
    reg [31:0] wait_min;
    reg [31:0] wait_max;

task set_response;
        input [31:0] response_type;
    begin
        response_mode = response_type;
    end
    endtask // set_response task set_wait_cycle;
        input [31:0] min;
        input [31:0] max;
    begin
        wait_min = min;
        wait_max = max;
    end
    endtask // set_wait_cycle
    // actual bus functional sequences
    // (suppressed)

endmodule // slave_model
```

FIG. 12

- Bus contention
- Bus starvation
- Multiple thread
- Multiple errors and normal transactions
- Uppredicted bahaviors
- Can check resource control among the I/F

```
module conflict_test;
    parameter loop_cnt = 1000;
    task test;
        integer l;
    begin
        $dispaly("TESTB: conflict_test started. ¥n");
        initialize_routine;
        for (l=0; l<loop_cnt; l=l+1) begin
            fork
                cpu_master_kick;
                io1_master_kick;
                io2_master_kick;
                io1_slave_kick;
                io2_slave_kick;
                dev1_master_kick;
                dev2_master_kick;
                dev1_slave_kick;
                dev2_slave_kick;
            join
        end // for (l=0; l<loop_cnt; l=l+1)
        $display("TESTE: conflict_test finished. ¥n");
    end
    endtask // test
endmodule // conflict_test
```

FIG. 16

```
module consequent_test;
   parameter loop_cnt = 1000;
   task test;
      integer I0;
      integer I1;
      integer I2;
      integer I3;
      integer I4;
      integer I5;
      integer I6;
      integer I7;
      integer I8;
   begin
      $dispaly("TESTB: consequent_test started. ¥n");
      initialize_routine;
      fork
         for (I0=0; I0<loop_cnt; I0=I0+1) begin
            cpu_master_kick;
         end
         for (I1=0; I1<loop_cnt; I1=I1+1) begin
            io1_master_kick;
         end
         for (I2=0; I2<loop_cnt; I2=I2+1) begin
            io2_master_kick;
         end
         for (I3=0; I3<loop_cnt; I3=I3+1) begin
            io1_slave_kick;
         end
         for (I4=0; I4<loop_cnt; I4=I4+1) begin
            io2_slave_kick;
         end
         for (I5=0; I5<loop_cnt; I5=I5+1) begin
            dev1_master_kick;
         end
         for (I6=0; I6<loop_cnt; I6=I6+1) begin
            dev2_master_kick;
         end
         for (I7=0; I7<loop_cnt; I7=I7+1) begin
            dev1_slave_kick;
         end
         for (I8=0; I8<loop_cnt; I8=I8+1) begin
            dev2_slave_kick;
         end
      join
      $display("TESTE: consequent_test finished. ¥n");
   end
   endtask // test
endmodule // consequent_test
```

FIG. 17

```
module random_test;
    parameter loop_cnt = 1000;
    parameter wait_max = 256;
    task test;
        integer 10;
        integer 11;
        integer 12;
        integer 13;
        integer 14;
        integer 15;
        integer 16;
        integer 17;
        integer 18;
    begin
        $dispaly("TESTB: random_test started. ¥n");
        initialize_routine;
        fork
            for (10=0; 10<loop_cnt; 10=10+1) begin
                cpu_master_kick;
            end
            for (11=0; 11<loop_cnt; 11=11+1) begin
                io1_master_kick;
            end
            for (12=0; 12<loop_cnt; 12=12+1) begin
                io2_master_kick;
            end
            for (13=0; 13<loop_cnt; 13=13+1) begin
                io1_slave_kick;
            end
            for (14=0; 14<loop_cnt; 14=14+1) begin
                io2_slave_kick;
            end
            for (15=0; 15<loop_cnt; 15=15+1) begin
                dev1_master_kick;
            end
            for (16=0; 16<loop_cnt; 16=16+1) begin
                dev2_master_kick;
            end
            for (17=0; 17<loop_cnt; 17=17+1) begin
                dev1_slave_kick;
            end
            for (18=0; 18<loop_cnt; 18=18+1) begin
                dev2_slave_kick;
            end
        join
        $display("TESTE: random_test finished. ¥n");
    end
    endtask // test
    task    io1_master_kick;
        integer wait_cycle;
        integer i;
    begin
        wait_cycle = $random() & wait_max;
        for (i=0; i<wait_cycle; i=i+1)
            wait @(posedge sys. clk);

sys. io1_master_model. transmit;
    end
    endtask // io1_master_kick;

endmodule // random_test
```

FIG. 18

```
module sweep_test;
   parameter loop_cnt = 1000;
   parameter default_wait = 64;
   parameter sweep_target = 9'b0_0000_0010;
   task test;
      integer l;
   begin
      $dispaly("TESTB: sweep_test started. ¥n");
      initialize_routine;
      for (l=0; l<loop_cnt; l=l+1) begin
         fork
            cpu_master_kick;
            io1_master_kick;
            io2_master_kick;
            io1_slave_kick;
            io2_slave_kick;
            dev1_master_kick;
            dev2_master_kick;
            dev1_slave_kick;
            dev2_slave_kick;
         join
      end // for (l=0; l<loop_cnt; l=l+1)
      $display("TESTE: sweep_test finished. ¥n");
   end
   endtask // test
   reg [31:0] io1_master_wait_cycle;
   initial io1_master_wait_cycle;

task io1_master_kick;
      integer l;
   begin
      if (sweep_target & 9'b0_0000_0010)
         begin
            for (i=0; i<io1_master_wait_cycle; i=i+1)
               wait @(posedge sys. clk);
            io1_master_wait_cycle = io1_master_wait_cycle + 1;
         end
      else
         for (i=0; i<default_wait; i=i+1)
            wait @(posedge sys. clk);

sys.io1_master_model. transmit;
   end
   endtask // io1_master_kick endmodule // sweep_test
```

FIG. 19

```
module test_with_master_module_and_dut;
  include "system_routines.vh" // includes system_***_routine task test_sequence_using_actual_master_if;
  begin
      system_initialize_routine;           // (step 1.1)
      mst_module_initialize_routine;       // (step 1.2)
      dut_module_initialize_routine;       // (step 1.3)

mst_module_dma_setting_routine(0);   // (step 1.4)
      mst_module_data_transmit_routine;    // (step 1.5)

mst_module_finalize_routine;         // (step 1.6)
      dut_module_finalize_routine;         // (step 1.7)
      system_finalize_routine;             // (step 1.8)
  end
  endtask // test_sequence_using_actual_master_if task mst_module_initialize_routine;
  begin
     write_reg(32'h1004_0004, 32'hffff_ffff); // clear all interrupt cause registers
     write_reg(32'h1004_0000, 32'h8000_0000); // enable the module
     // and so on ...
  end
  endtask // mst_module_initialize_routine task mst_module_dma_setting_routine;
     input [31:0] mode;
  begin
     write_reg(32'h1004_0008, mode);
     write_reg(32'h1004_000c, 32'h4000_0000); // start address
     write_reg(32'h1004_0010, 32'h4000_0ffc); // end address
     // and so on ...
  end
  endtask // mst_module_dma_setting_routine task mst_module_data_transmit_routine;
  begin
     write_reg(32'h1004_000c, 32'h4000_0000); // activate DMA
     // and so on ...
  end
  endtask // mst_module_data_transmit_routine task mst_module_finalize_routine;
  begin
     write_reg(32'h1004_0000, 32'h0000_0000); // disable the module
  end
  endtask // mst_module_finalize_routine task dut_module_initialize_routine;
  begin
     write_reg(32'h1008_0000, 32'h8000_0000); // enable dut
     // and so on ...
  end
  endtask // dut_module_initialize_routine task dut_module_finalize_routine;
  begin
     write_reg(32'h1008_0000, 32'h0000_0000); // disable dut
     // and so on ...
  end
  endtask // dut_module_finalize_routine endmodule // test_with_master_module_and_dut
```

FIG. 23 (PRIOR ART)

METHOD FOR LOGIC CHECKING TO CHECK OPERATION OF CIRCUIT TO BE CONNECTED TO BUS

CROSS-REFERENCE TO RELATED APPLICATION

The present application is a division of U.S. application Ser. No. 10/291,508, filed on Nov. 12, 2002, now U.S. Pat. No. 7,548,841, issued Jun. 16, 2009, the entire disclosure of which is incorporated by reference herein.

BACKGROUND OF THE INVENTION

1. Field of the Invention

The present invention relates to a logic checking method for checking operation of circuit which is to be connected to bus in System LSI or the like.

2. Description of the Related Art

Hitherto, checking of logic during development of System LSI which has an integrated CPU is conducted using actual logic circuit by performing simulation using software which runs on an actual machine.

First, a prior art logic checking method is described with an example in which an arbiter is an object to be checked. When a plurality of bus master circuits connected to a certain bus try to access to one or more bus slave circuit or circuits, one of them must first obtain priority of accessibility to avoid collision of signals from different bus masters over the bus.

An arbiter is a circuit of which function is to arbitrate the accessibility. In the prior art checking of an arbiter is conducted by actually connecting logic circuits which are used as bus masters.

FIG. 20 shows a prior art checking method of an arbiter in which Master A 220, Master B 221 and Master C 222 are blocks to operate as masters on bus 240. Slave D 230 is a block to operate as a slave on bus 240. Only single slave is connected to the bus 240 in this example but more than one slave may be connected. The Arbiter 210 is a block to perform arbitration of the accessibility to bus 240. This Arbiter 210 is an object of logic checking.

A master block first requests the Arbiter 210 to give accessibility priority to the bus 240 to avoid collision with other masters when it tries to gain access to a slave block (to transmit data or to request data). The Arbiter 210 arbitrates requests for bus accessibility from masters to issue bus access permission signals to a master. A master block can gain access to a Slave D 230 via bus 240 only after it obtained this permission signals.

As shown in the example of FIG. 20, there may be various kinds of bus masters with various functionality, such as, for example, a Master A 220 which receives data via bus 250 which is a different path from the bus 240 to transmit them to the Slave D 230 after given processing, or a Master B 221 which has an additional functionality for requesting data to the Slave D 230 to output obtained data via the bus 251 after given processing besides the similar functionality with Master A 220, or a Master C 222 which has no other interface than the bus 240 for data reception and transmission and requests data to the Slave D 230 for returning obtained data to the Slave D 230 after given processing.

FIG. 21 shows the way how arbitration is conducted. In this case, the order of priority of bus accessibility to be issued by the function of the Arbiter 210 between the Master A 220, the Master B 221 and the Master C 222 is set as "Master A>Master B 221>Master C". Also, in this example, any of the bus masters conducts only data transmission to the Slave D 230 but makes no request for data to it. The burst length of data transmission is fixed at 4 bursts.

In FIG. 21 the Master A 220 issues a request for bus accessibility req a at timing a and the Arbiter 210 returns an acknowledgement signals ack a at timing b. Receiving this, the Master A 220 starts data transmission at timing c. During the same period, the Master B 221 issues a request for bus accessibility req b at timing c and the Master C 222 req c at timing d, respectively, but it is shown that they are kept waiting.

When data transmission of the Master A 220 is over, the Arbiter 210 returns acknowledgement signals ack b to Master B 221 at timing g. At timing g requests for bus accessibility for Master B 221 and Master C 221 compete but since a higher priority is given to Master B 221, an acknowledgement is given to Master B 221. In this way the Arbiter 210 arbitrates bus accessibility to prevent collision over the bus 240. Bus 240 in FIG. 21 shows this.

In such bus arbitration, if only such a case is considered as Master A 220 and Master B 221 are in competition, for example, test items to be checked on bus arbitration circuit are those events where; (1) only req a is issued, (2) only req b is issued, (3) both req a and req b are issued, with req a issued earlier, (4) both req a and req b are issued, with req b issued earlier, (5) both req a and req b are issued simultaneously, (6) both req a and req b are simultaneously issued, while currently Master A 220 is receiving acknowledgement signals ack a, and (7) both req a and req b are simultaneously issued, while currently Master B 221 is receiving acknowledgement signals ack b. To check logic of the arbiter circuit, it is required to cause all of the above events occur but, for example, even if it is desired to cause "(5) both req a and req b are issued simultaneously", Master A 220 and Master B 221 which are actual circuitries can issue request signals only after a given processing, so that it is impossible to control timing of issuance of a bus access request at will. Accordingly, it is necessary to keep two masters executing transactions for issuing a bus access request until simultaneous output of requests for access is achieved by both masters.

The more number of bus master circuits is, the more complex their combination becomes, thus increasing the number of test items. As a result it would take very long simulation time to perform tests of all the test items necessitating a large number of test statements.

Further, as for the timing of start of checking, checking of an arbiter can be conducted only after completion of each of bus master circuits (completion of checking). If checking of an arbiter is conducted using a bus master circuit of which checking is not completed and any failure develops, it would be difficult to specify whether the cause of the failure lies in the bus master circuits or in the arbiter, resulting in a long checking period.

Next, described is logic checking for such circuits as memory controllers, I/O interfaces and bus bridges. FIG. 22 shows a prior art test bench consisting of actual circuits only. As shown here, a test is conducted using such circuitries as CPU and DMA (Direct Memory Access) controller which are actually connected to an object to be checked. FIG. 23 shows an example of statements of a prior art test sequence for logic checking. Main flow of the test code is described as follows.

1. (step 1.1) initialize checking the test bench as a whole, 2. (step 1.2) initialize the actual circuits which are connected to the object to be checked, 3. (step 1.3) initialize the object to be checked, 4. (step 1.4) setting for data transmission the actual circuits connected to the object to be checked, 5. (step 1.5) activate data transmission of the actual circuits connected to the object to be checked, 6. (step 1.6) finalize the actual circuits connected to the object to be checked after data transmission is completed, 7. (step 1.7) finalize the object to be checked, and 8. (step 1.8) finalize the test bench as a whole.

In the above steps 1 and 2 included are such processes as fetching from memory of a program to be processed in the CPU and initialization of DMA. Steps 2, 4, 5 and 6 are the processes required for operation of the actual circuits connected to the object to be checked. The larger the scale of an LSI is, the more complex these processes tends to become and those processes become overheads at a time of a simulation, when the object to be checked is being checked. If some malfunction develops in the related portion resulting in a failure of achieving a desired performance, testing of the object to be checked would be made difficult. Also, in case of DMA, it would be difficult to test the object to be checked under a situation in which all modes of data transmission specified by the bus are caused to take place. Also, selection of addresses required in data transmission at will or arrangement of such addresses in desired order would be difficult to conduct only by setting of DMA.

FIG. 24 is a block diagram showing an object of a simulation in a prior art. A bus bridge 2 connects various buses within circuit to control data transmission between buses. A memory 3 is a storage device. A memory controller 4 controls write/read operations into or out of the memory 3. An IO-bus 5 provides a data path for data transmission within the circuit between various input/output devices or machines. Each of IO1 interface 6, IO2 interface 7 and IO3 interface 8, respectively controls data transmission to and from I/O devices connected to this circuit. A device bus 11 is a data path for data transmission between logic circuits within the circuit. A device (1) 12 and a device (2) 13 have logic function such as compression and/or expansion, respectively. A CPU 20 controls the circuit as a whole. A ROM 21 stores programs etc.

The prior art example described in FIG. 24 is solely comprised of functions used in actual circuit. A CPU 20 executes programs retrieved from the ROM 21, for example, to transfer the resulting contents to the memory 3 and then executes instructions read out of memory 3. In this case the instruction read out of memory 3 decides what to be executed next by CPU 20, so that instruction fetching necessarily takes place before any transmission of data, except that an instruction is held in a cache within the CPU 20.

As described above, checking of a logic circuit requires a simulation to be conducted by preparing actual software statements to produce a ROM image. However, it is not easy to make statements in actual software to produce stimuli for achieving checking of a desired functional block and requirement of initialization of various components such as a CPU makes it difficult to conduct a checking simply. Furthermore, if a CPU is actually used in a simulation, execution will be very time-consuming. What will take only about 10 seconds in an actual machine would sometimes take 24 hours for a run in a simulation.

In the prior art example given in FIG. 24 starting data transmission from other devices than the CPU 20 would require activation of DMA by setting IO1 interface 6 etc. In this case different setting methods must be applied to each I/O and transfer rate is decided depending on what kind of I/O device is used.

Accordingly, in addition to complex setting processes themselves, only limited number of transfer modes is available. This makes it impossible to achieve consecutive transmission to take place, thus complex situation under which various cases occur can not be created. As a result complete checking is difficult to be performed.

SUMMARY OF THE INVENTION

It is an object of the present invention to provide a method for logic checking which can easily start operation without complex setting and which allows complete checking even on a complex situation.

Another object of the present invention is to provide a method for logic checking which can be performed under severer than actual conditions.

According to one aspect, the present invention which achieves these objectives relates to a method for logic checking to check operation of a circuit to be checked connected to a bus to which at least one master circuit and at least one slave circuit are connected, comprising the steps of connecting a model or models to said bus in place of said master circuit or said slave circuit, outputting given signals at given timing from said model or models and checking the operation of said circuit to be checked.

Further objects, features and advantages of the present invention will become apparent from the following description of the preferred embodiments with reference to the attached drawings.

BRIEF DESCRIPTION OF THE DRAWINGS

FIG. 6 shows an example of statements for a test sequence of the present invention.

FIG. 8 shows an example of statements for a master model.

FIG. 9 shows an example of statements for a test sequence focusing on the transfer timing of bus according to an embodiment of the present invention.

FIG. 12 shows an example of statements for a slave model.

FIG. 16 shows an example of statements for a test to execute a simulation.

FIG. 17 shows another example of statements for a test to execute a simulation.

FIG. 18 shows other example of statements for a test to execute a simulation.

FIG. 19 shows further example of statements for a test to execute a simulation.

FIG. 23 shows an example of statements for a test sequence according to a prior art.

DESCRIPTION OF THE PREFERRED EMBODIMENTS

A preferred embodiment of the present invention will be described in detail with reference to the drawings.

First Embodiment

Figure 1:
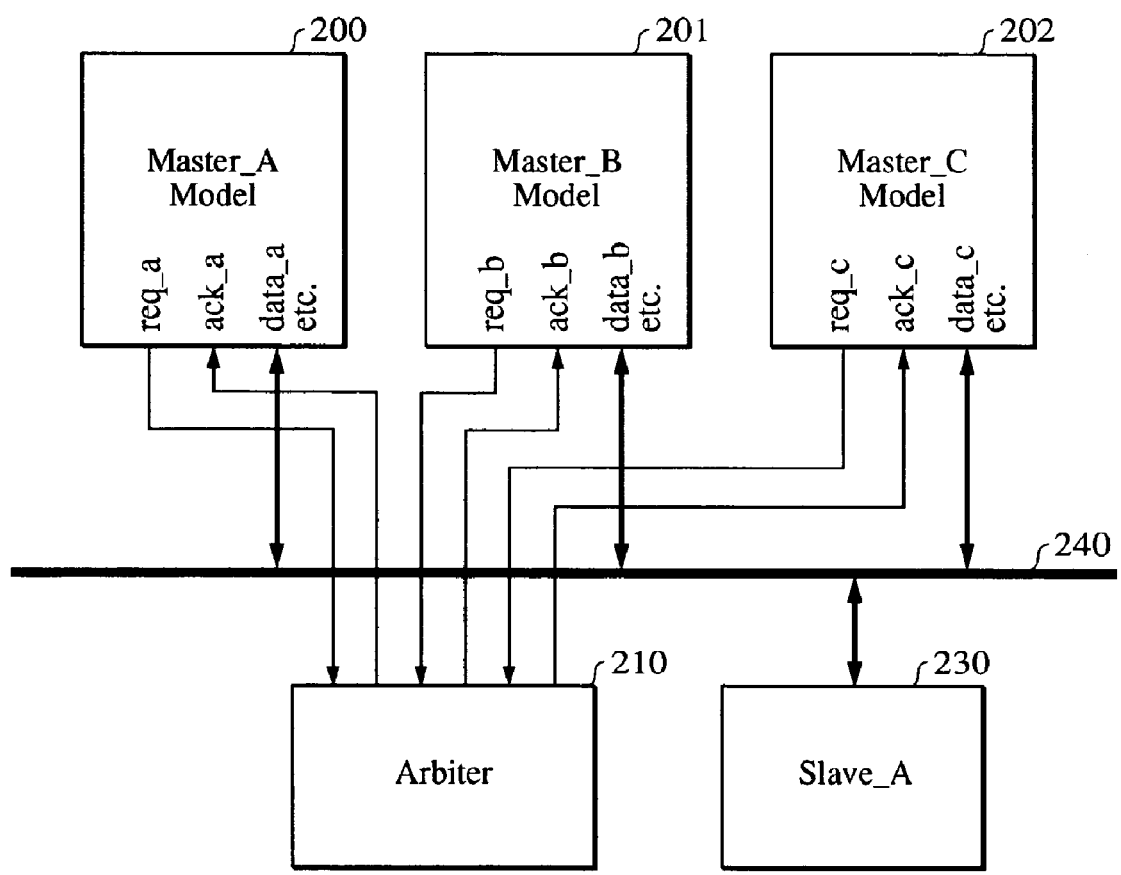
FIG. 1 shows the method for checking an arbiter circuit according to an embodiment of the present invention.

FIG. 1 shows a construction of a system for the checking method according to an embodiment of the present invention. In this example connected to the bus in place of the prior art bus master circuits are bus master models which are capable to perform bus access according to bus protocol.

Figure 2:
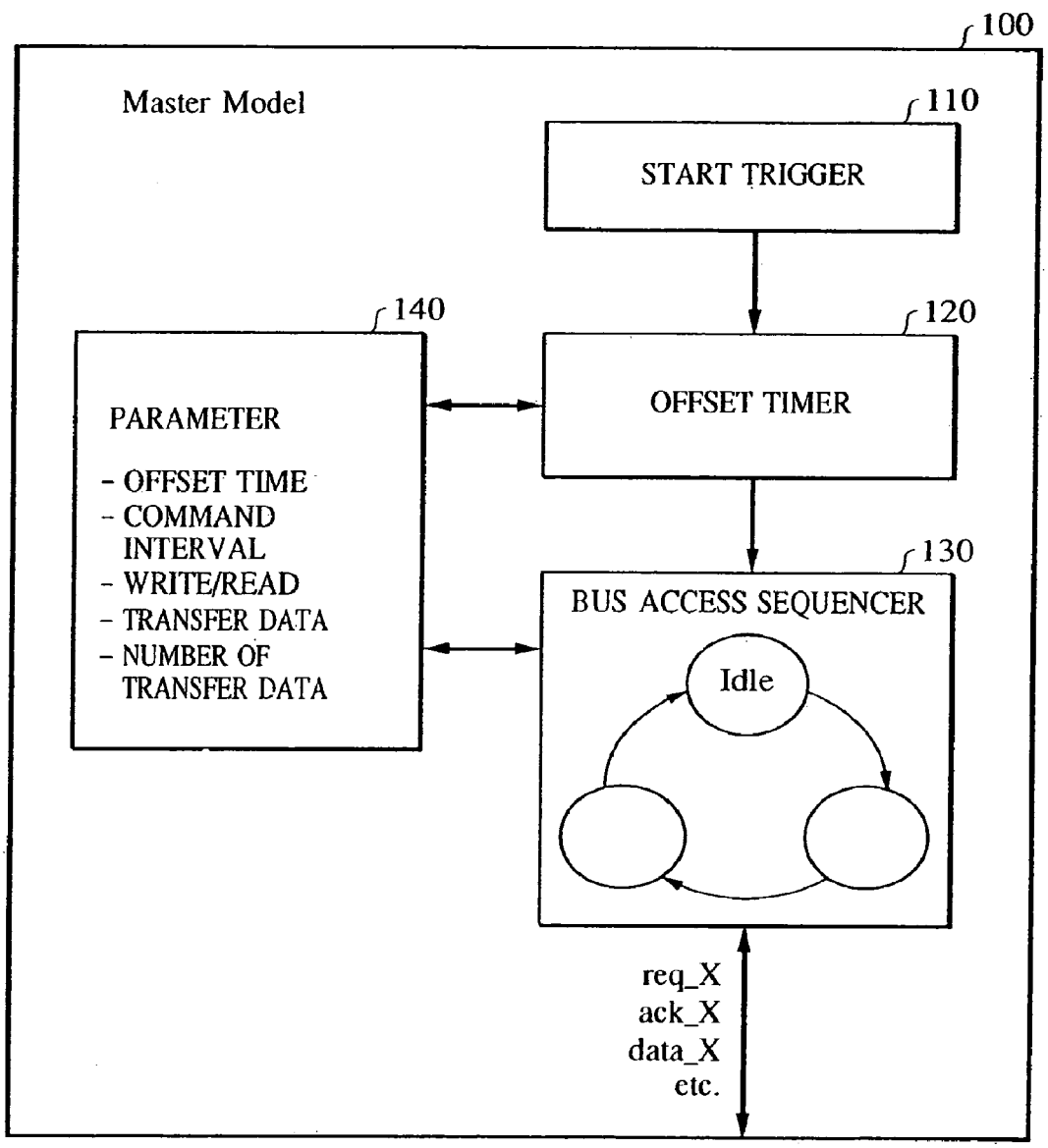
FIG. 2 is a block diagram showing a construction of a bus master model.

FIG. 2 shows the construction of the bus master models. The bus master model 100 in FIG. 2 has a start trigger 110, a offset timer 120, a bus access sequencer 130 and various parameters 140. The start trigger 110 receives a start command from the test statements.

Parameters included in the various parameters 140 are "offset time" which specifies offset time between reception of a start command and activation of a bus access, "command interval" which specifies an interval between an end of a bus access and activation of the next bus access, "Write/Read" which distinguishes whether an access is for a data transmission or for a request of data, "transfer data" which specifies a value of transfer data and "number of transfer data" which specifies a number of transfer data. The parameters 140 may be directly designated from the test statements or may be generated dynamically within the master model.

The Offset timer 120 refers to the offset time in the parameters 140 to hold start of a bus access for clock cycles corresponding to its value. The bus access sequencer 130 is activated after being held for offset time by the offset timer 120 to activate a bus access according to the bus protocol. Details of an access are defined by the parameter 140. How many times the transfer is to be conducted is defined by the "number of transfer data" parameter. If an access is defined as "data transfer access", the value of transfer data is available by referring to the "transfer data" parameter.

Figure 3:
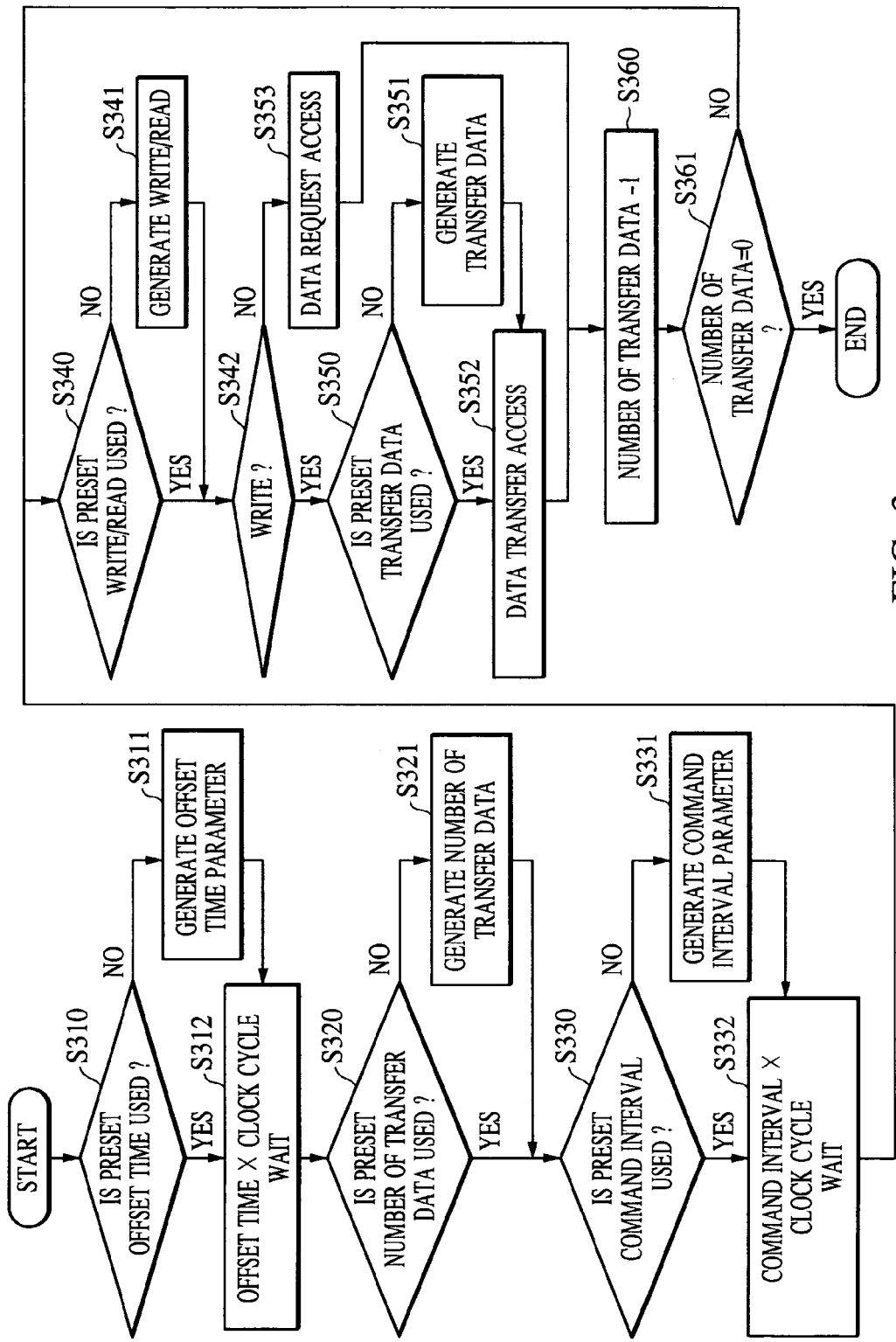
FIG. 3 is a flow chart showing operational sequence of the bus master model.

At the end of an access the next access is activated after waiting for clock cycles given by the "command interval" parameter. "Transfer data" parameter may be provided as a list directly from the test statements or may be dynamically generated by the bus master model 100 every time it activates a bus access. FIG. 3 is a flow chart illustrating details of operation of the master model.

In step S310, determined is whether a preset offset time is to be used or not. If not, in step S311, an offset time parameter is generated. In step S312, processing is kept waiting for a time period defined by "offset time×clock cycles" using the preset offset time or the generated offset time. In step S320, determined is whether a preset number of the transfer data is to be used or not. If not, in step S321, a number of the transfer data is generated. In step S330, determined is whether a preset command interval is to be used or not. If not, in step S331, a command interval parameter is generated. In step S332, processing is kept waiting for a time period defined by "command interval×clock cycles" using the preset command interval or the generated command interval parameter.

In step S340, determined is whether a preset write/read is to be used or not. If not, in step S341, a write/read parameter is generated. In step S342, determined is whether an access is "write" or not. If it is "write", in step S350, determined is whether a preset transfer data is to be used or not. If not, in step S351, a transfer data is generated. In step S352, the transfer data is transferred to perform a write access. On the other hand, if an access is not "write" but "read", in step S353, a data request access is performed. After the end of an access, in step S360, one is deducted from the number of transfer data to determine, in step S361, whether the number of transfer data is 0 or not. If it is not 0, processing returns to step S340 to repeat steps from S340 to S361 until the number of transfer data is determined to be 0 in step S361.

Figure 20:
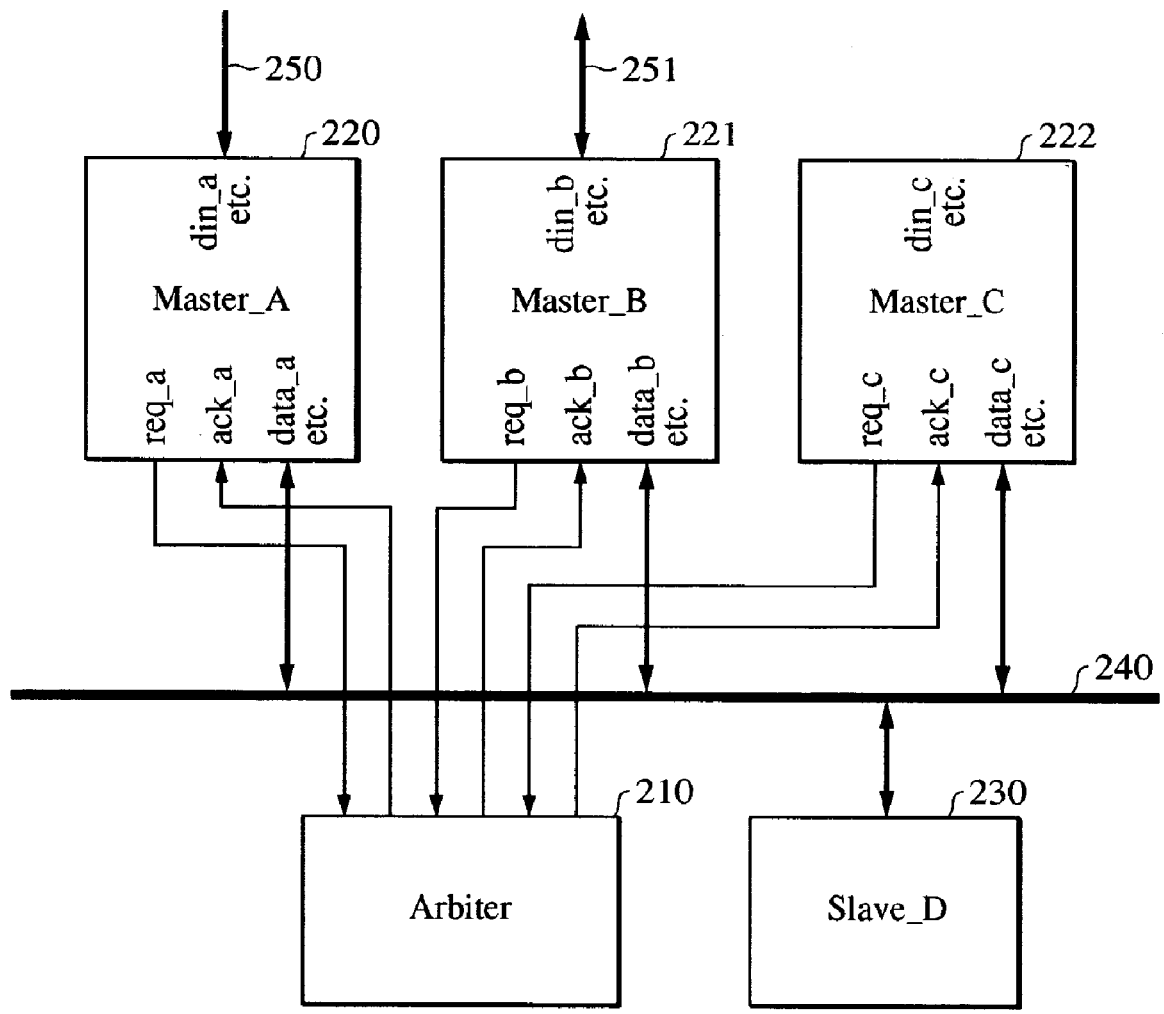
FIG. 20 shows a method for checking arbiter circuit according to a prior art.
Figure 21:
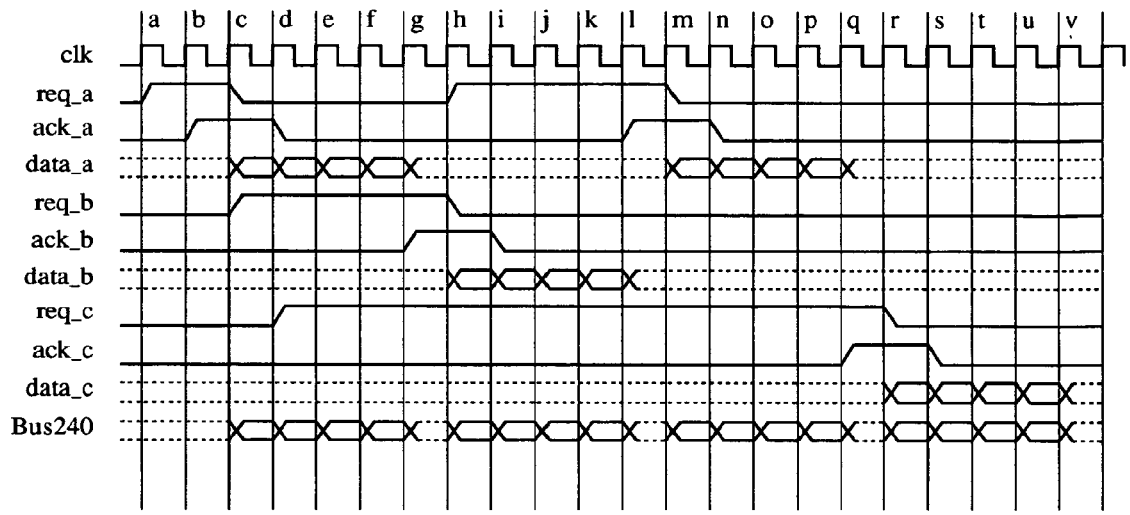
FIG. 21 is a timing chart showing a sequence of the bus arbitration.
Figure 22:
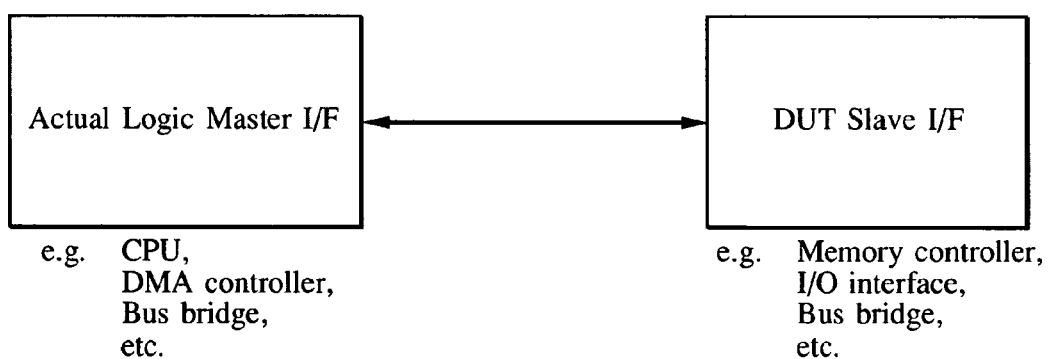
FIG. 22 shows a prior art test bench using only actual circuits.

In FIG. 1 each of the bus masters in FIG. 20 is replaced with the bus master model 100 of FIG. 2. FIG. 1 illustrates an embodiment according to the present invention of a method for checking a bus arbiter. Master A 220, Master B 221 and Master C 222 in FIG. 20 are replaced with Master A Model 200, Master B Model 201 and Master C Model 202 in FIG. 1, respectively.

According to the checking method shown in FIG. 1 if it is desired to simulate a situation, for example, where "both Master A and Master B request bus accessibility simultaneously" which is mentioned previously as one of checking items for an arbiter 210, this is achieved by providing the same "offset time" parameter to both Master A Model 200 and Master B Model 201, thus realizing easy control. Other combinations of cases may be available easily by controlling the "offset time" parameter and the "command interval" parameter of the master model. Preparing test statements to bring forth all test items by controlling those master models could be very time consuming but this arrangement allows generating such parameters as "offset time" parameter and "command interval" parameter during operation of master models as shown in steps S311 or S331 in the flow chart of FIG. 3, so that shorter checking period may be achieved by automatically activating some of test items, while only test statements for the remainder may be produced under control of a human operator.

In FIG. 20 bus master circuits with various functions are connected to the bus arbiter circuit, but all of them are replaced with the same bus master models in the present checking method. This master model can be made to perform only data transfer access to a slave, as is the case of the Master A of FIG. 20, by fixing "write/read" parameter to write. Accordingly, it can not only conduct of checking of a bus arbiter circuit by simulating operation of the actual circuit faithfully but as it has more functionality than an actual circuit, it can check an arbiter circuit as a more universally applicable unit and warrant its functionality.

Second Embodiment

Figure 4:
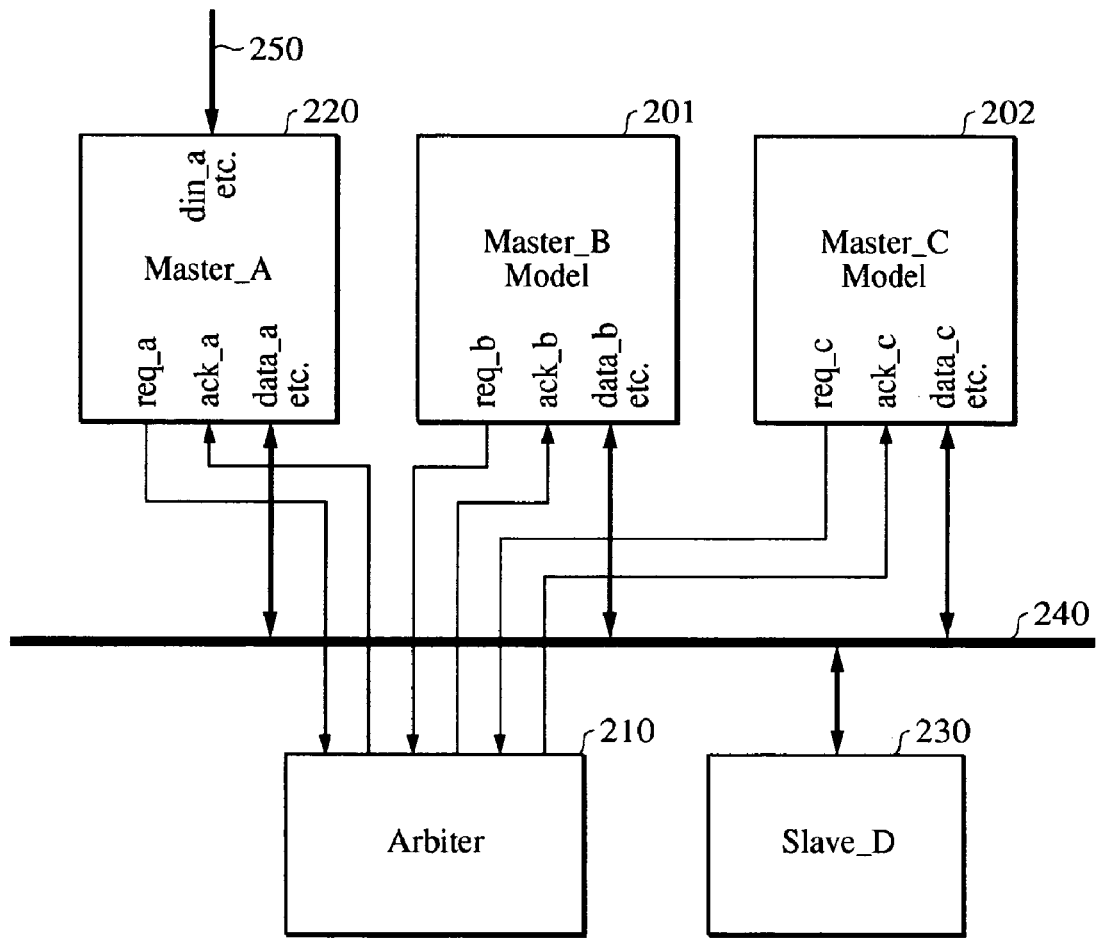
FIG. 4 shows another embodiment of the method for checking.

In the first embodiment, all of bus master circuits connected to a bus arbiter circuit are replaced with bus master models but in the second embodiment only Master B 221 and Master C 222 in FIG. 20 of a prior art are replaced with master models to use a combination of an actual circuit bus master and the master models. FIG. 4 illustrates this example.

In this case Master B Model 201 and Master C Model 202 can cause various bus accesses against a bus access of Master A 220. As described above, a bus master model can both intentionally or randomly perform a bus access, so that it allows conducting efficient checking of bus access function of Master A 220. This provides an advantage that a logic checking can be conducted regardless of progress in development of design for Master B and Master C.

According to the above embodiment, it is possible to achieve complex cases (combinations of request signals from each master model) easily and shorten time required to cause these cases to occur, which serves to facilitate, to enhance accuracy and to improve efficiency in logic checking of an arbiter.

Third Embodiment

Figure 5:
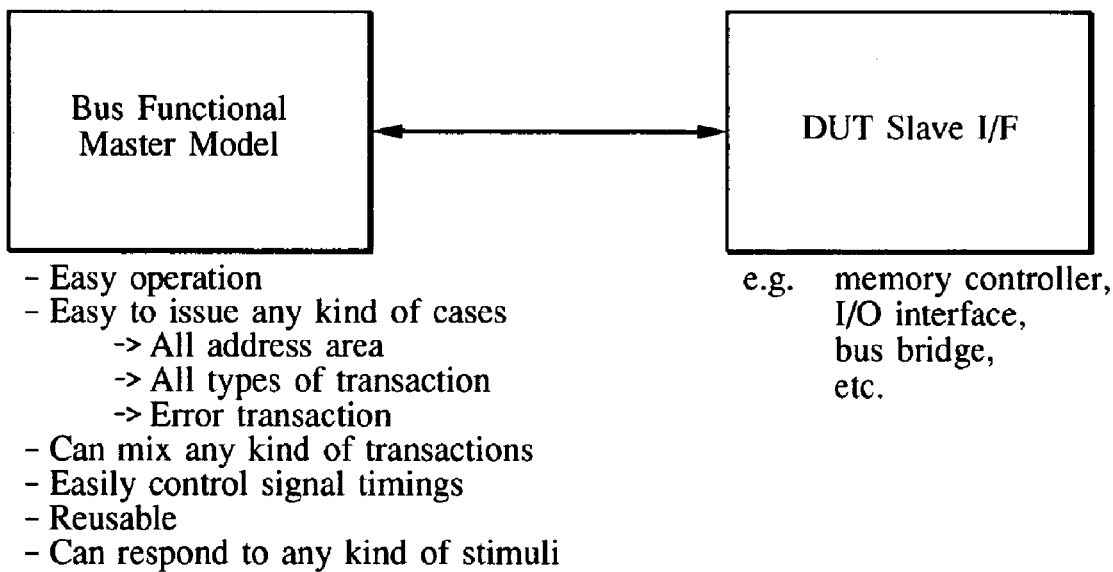
FIG. 5 shows a test bench using a bus master model.

Next described is logic checking for such circuits as a memory controller, an I/O interface or a bus bridge. FIG. 6 gives an example of test statements using master models. In this checking method, as shown in FIG. 5, used is a master model which is connected in a location in the circuit as near as possible to an object to be checked in stead of using an actual CPU and circuit. This allows to eliminate such pre-processing and post-processing steps of circuits connected to the object to be checked as steps 1.2, 1.4 and 1.6 which are required in the prior art example of FIG. 23.

Now, reference is made to FIGS. 6 to 10 to describe logic checking method and example of statements for the present embodiment. In this method, as shown in FIG. 5, used is a master model which is connected in a location in the circuit as near as possible to an object to be checked in stead of using an actual CPU and circuit. This allows to eliminate such pre-processing and post-processing steps of circuits connected to an object to be checked as steps 1.2, 1.4 and 1.6 which are required in the prior art example of FIG. 23. This allows achieving a more rapid simulation. There is no need to restrict address area in software which is actually to be run on a CPU or restrict address in setting for DMA, so that address can be selected arbitrarily.

Figure 7:
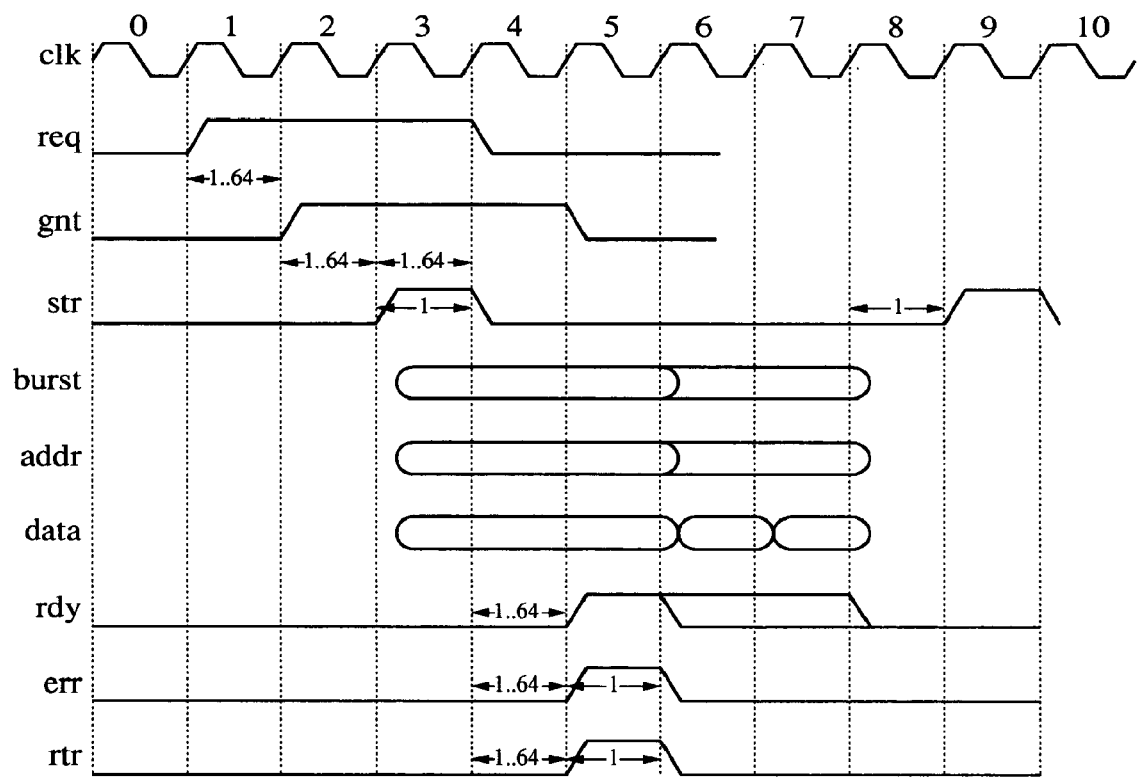
FIG. 7 shows an example of bus protocol to which the models are connected.

Next described is a mode of data transfer such as one given in FIG. 7 as an example of data communication between bus masters and bus slaves on a bus to which an object to be checked is connected. In this instance data transfer is performed in synchronization with clock signal clk.

In the transfer sequence, first a bus master asserts request signals as a request for transfer. Against these request signals any one of devices such as a bus slave or an arbiter asserts gnt signals to grant transfer permission to the bus master. Secondly, the bus master asserts during one cycle str signals which indicates start of transfer after it confirmed that gnt signals are asserted. Simultaneously with assertion of str signals, the bus master asserts such signals as burst signals which indicate number of transfer data, addr signals which indicate transfer address and data signals which indicate transfer data. Burst signals, addr signals and data signals are kept asserted until transfer is completed.

Thirdly, the bus slave asserts rdy signals when it is ready to receive data to be transferred to obtain data. Rdy signals are continuously asserted during clock cycles of which number is indicated by the burst signals to receive data continuously. If, for any reason, the bus slave fails to receive transfer data against transfer start signals str asserted by the bus master, it will assert err signals in place of rdy signals. In case it cannot receive transfer data at the moment but it will be able to receive them after a while, it may assert rtr signals as a request for retrial of transfer.

In this case if the timing for a period after assertion of req signals by a master I/F and assertion of gnt signals for transfer permission until assertion of str signals is not uniquely defined, the timing may vary depending on connected modules or mode. Even in such a case, as shown in FIG. 8, transfer can be executed simply with available timing defined in the protocol by providing the master model a function for executing transfer by simply changing its timing. This enables to perform more thorough checking based on the protocol. FIG. 9 illustrates an example of test statements of a case in which such a master model is provided. In such a test, described are examples of statements for a test sequence in which timing is randomly selected and a test sequence in which execution is performed with timing being delayed by one cycle for each run.

Figure 10:
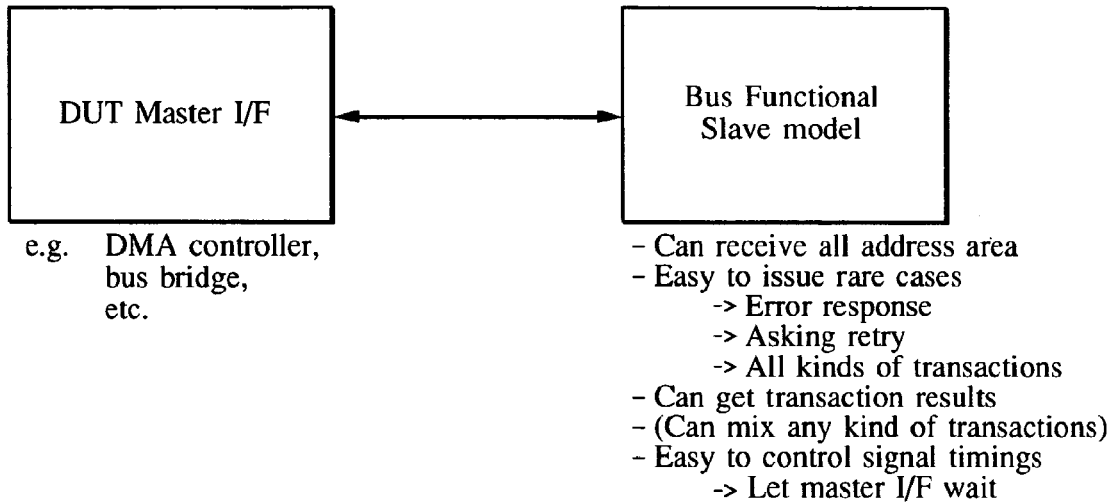
FIG. 10 shows a test bench using a slave model.

Next discussed is checking of such master I/F as a DMA controller or a bus bridge shown in FIG. 10. Similarly as the case using a bus master model described in FIG. 5, a slave model is used in place of an actual slave I/F to be connected. This eliminates time consuming pre-processing and post-processing of an actual slave I/F. Further, if a protocol provides setting of timing for changing signals arbitrarily for a certain extent, transfer can be simply conducted in an available timing defined in the transfer protocol by preparing a slave model as shown in FIG. 12, so that all possible cases are realized. This enables to perform more thorough checking based on such a protocol.

Next, discussed is an advantage available by using a combination of those master models and slave models.

Figure 11:
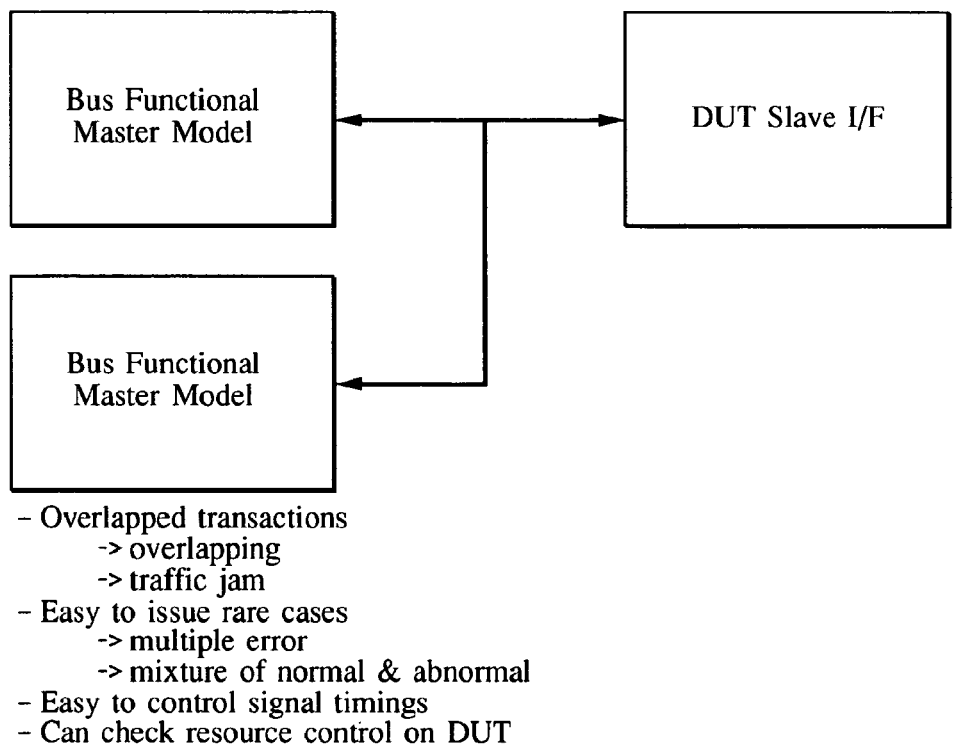
FIG. 11 shows a test bench using a plurality of master models.

When checking is performed on a slave circuit such as a memory controller, an I/O interface circuit or a bus bridge, in case a transfer protocol allows successive transfers to overlap each other, or in case a plurality of slave I/Fs operate to respond a plurality of transfer requests simultaneously and arbitration is conducted within the object to be checked itself, a plurality of master models are used to conduct the checking as shown in FIG. 11. This enables to confirm complex transactions such as overlapped and continuous transfers or overlapping transfers with one of which is an error transfer.

Figure 13:
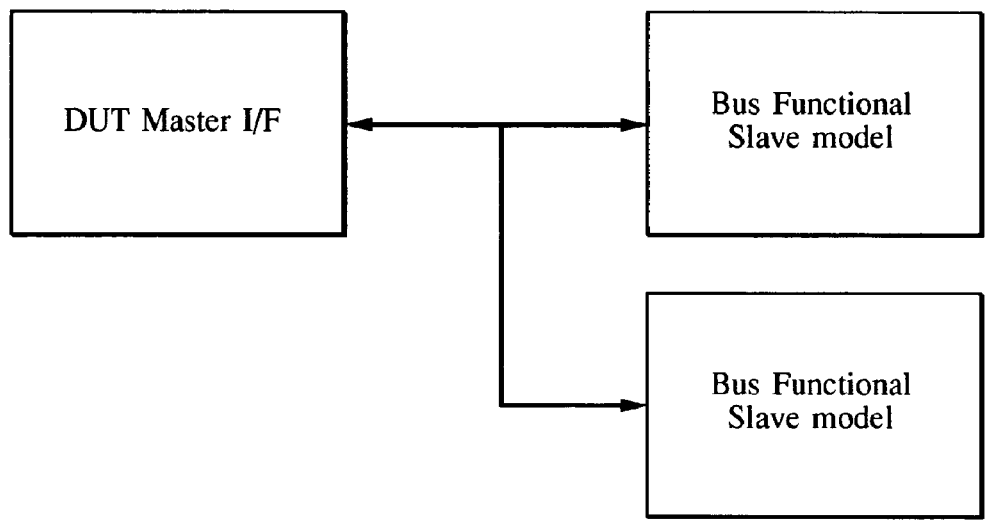
FIG. 13 shows a test bench using a plurality of slave models.

Similarly, as shown FIG. 13, it is possible to respond a plurality of transfer requests simultaneously by using a plurality of slaves. This allows easily confirming overlapped transfers, realizing various cases easily such as a combination of an error response and a normal response.

Figure 14:
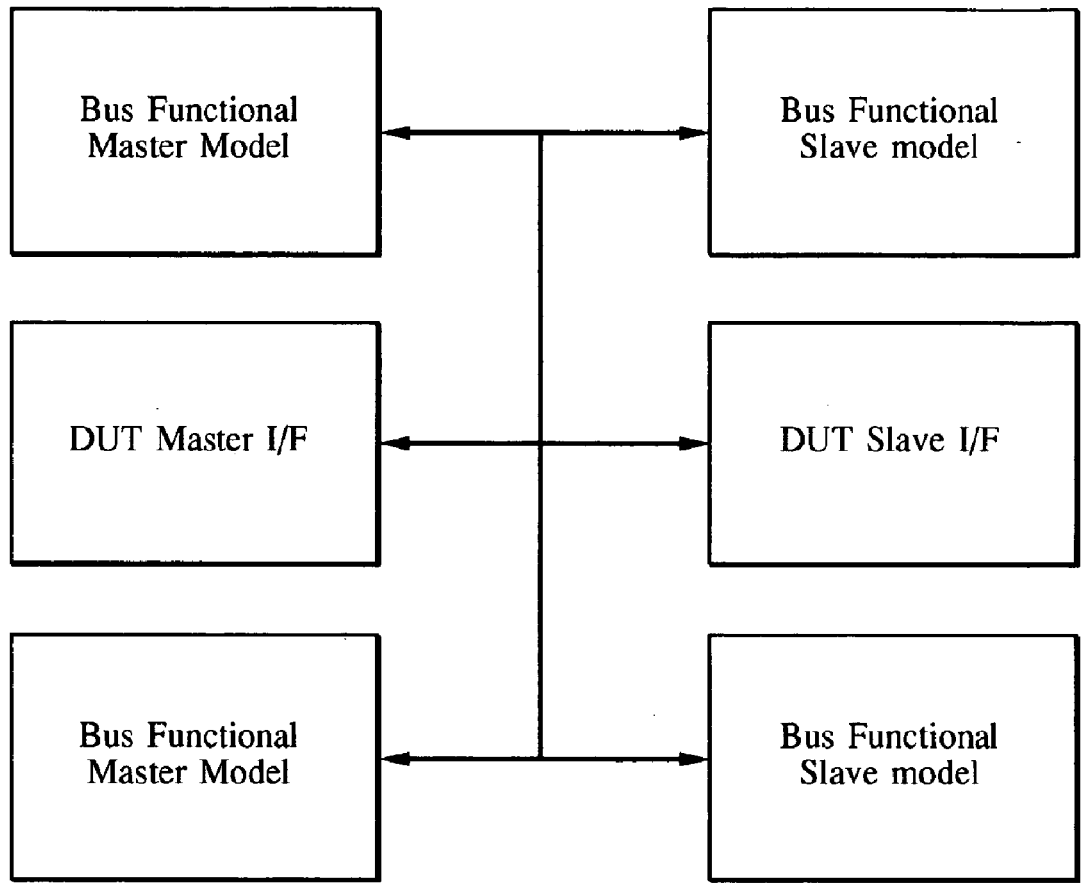
FIG. 14 shows a test bench using a plurality of both master models and slave models.

Combining those arrangements will enable to check more complex operations. As shown FIG. 14, it is possible to confirm behaviors in such cases as collision or competition of transfer, the concurrent execution of a plurality of processes, overlapping of error and normal transfer, resource control or unpredicted events by causing such cases develop intentionally.

Accordingly, as described above, the present method is advantageous for checking many of such functional blocks comprising system LSI as a bus bridge, memory controller, modules to be connected to general purpose buses and bus arbiters.

The present embodiment, in the first place, is able to cause a logic circuit to be checked to develop interesting operation, even without actual software by using bus functional models in place of actual CPUs, as well as to cause random data transfer with random values to develop which cannot be achieved by actual software. This makes it possible to check, by a simulation, such situations as a designer did not intend.

According to the present embodiment it is possible, by providing a plurality of master models and/or slave models, to cause data transfer of random varieties with random values to occur which cannot be achieved by actual software. This makes it possible to check, by a simulation, such situations as a designer did not intend.

Figure 15:
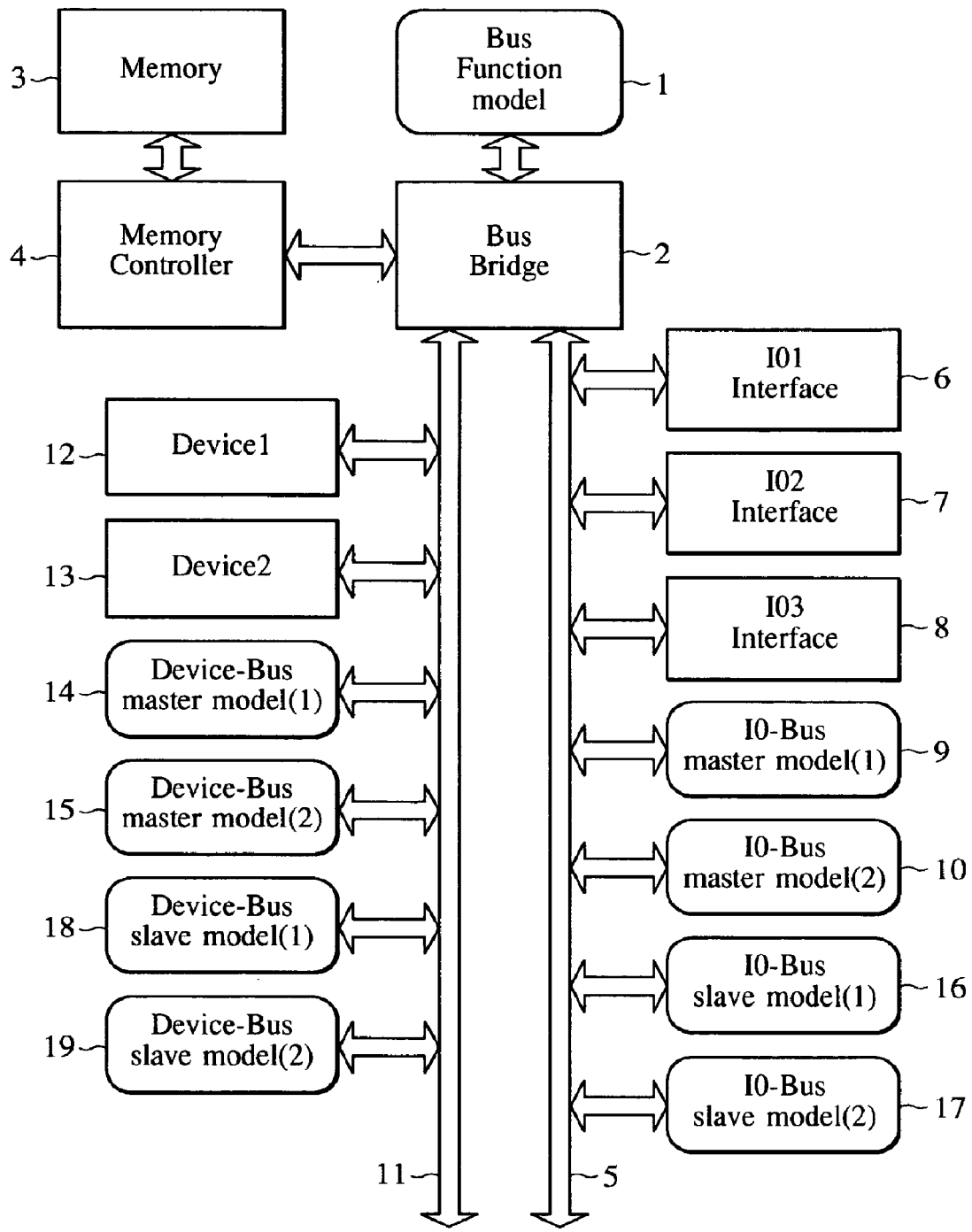
FIG. 15 is a block diagram showing an object of a simulation.
Figure 24:
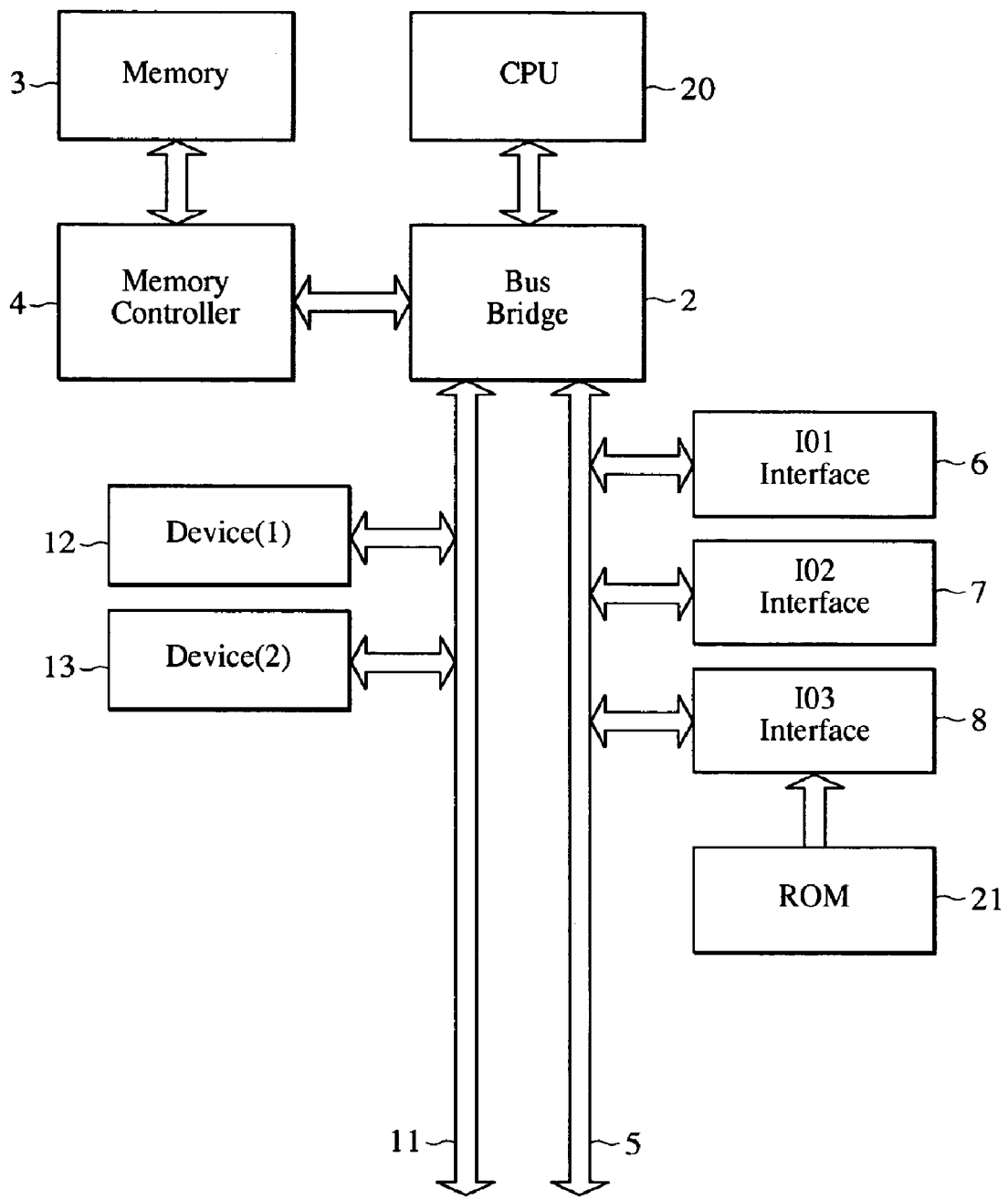
FIG. 24 is a block diagram showing an object of a simulation according to a prior art.

Now, a method for checking logic according to the present embodiment will be described referring to FIGS. 15 to 19. In FIG. 15 illustrating one of configuration of the present embodiment, reference numerals 2 to 8 and 11 to 13 denote the like components in FIG. 24. A bus function model 1 generates only bus operation signals of CPU which controls a whole circuit. IO-bus master model(1) 9, IO-bus master model(2) 10, device-bus master model(1) 14 and device-bus master model(2) 15 generate data transfer in place of actual circuits. IO-bus slave model(1) 16, IO-bus slave model(2) 17, device-bus slave model(1) 18 and device-bus slave model(2) 19 respond to data transmission requests from masters in place of actual circuits.

The bus function model 1 in FIG. 15 can generate, by command, only changes of signals which appear on the bus out of actual CPU functions. In this case, instruction fetching conducted by the CPU is not necessary. As a result, generation of desired data transfer can be easily achieved without any redundant transfer. For example, writing data into an address in the memory 3 etc. can be executed by only issuing such a command as write(address, data); included in the bus function model 1.

IO-bus master model(1) 9 or IO-bus master model(2) 10 in FIG. 15 can generate various data transfer over the IO-bus 5 without complex setting. In those cases only issuing such a command as io_write(address, data) is required. The same applies to device-bus master model(1) 14 and device-bus master model(2) 15.

IO-bus slave model(1) 16 and IO-bus slave model(2) 17 are slave models which respond to transfer requests from the bus function model 1 or the master models such as IO-bus master model(1) 9. They can respond not only in preset cycles but also, can respond by waiting for only random cycles. Random data may be generated when data is transferred from those slave models. In many cases bugs of logic circuits tends to exists at the time of such other than normal transactions as bus errors or retry. It is possible to have those salves respond to a bus error or a retry and this will be effective to find bugs in a logic circuit. The same applies to device-bus slave model(1) 18 and device-bus slave model(1) 19.

As described above it is possible to check such situations as a designer did not intend or a combination of transactions in complex cases by using master models and/or slave models which does not exist in actual circuit.

FIG. 16 describes an example of test statements for checking by activating various models above described. In this example, in a portion between "fork" and "join", tasks stated in each line works concurrently. For example, cpu_master_kick and io1_master_kick will be started concurrently.

For example, in FIG. 16, cpu_master_kick makes such statements as to generate transfer to the memory 3 or IO-bus slave model(1) 16 etc. from the bus function model 1 in random sequences with random addresses. Similarly, in io1_master_kick stated is a transfer sequence from IO-bus master model(1) 9, in io2_master_kick a transfer sequence from IO-bus master model(2) 10, in io1_slave_kick a transfer sequence to IO-bus slave model(1) 16, in io2_slave_kick a transfer sequence to IO-bus slave model(2) 17, in dev1_master_kick a transfer sequence from device-bus master model(1) 14, in dev2_master_kick a transfer sequence from device-bus master model(2) 15, in dev1_slave_kick a transfer sequence to device-bus slave model(1) 18, in dev2_slave_kick a transfer sequence to device-bus slave model(2) 19, respectively.

As described above, by stating such transfer sequences in each task as data transfer sequences from each master model or transfer sequences from a CPU to slave models, transactions from each master to the memory or each of slaves will occur, so that the logic circuit under checking conducts processing according to its designed logic.

In an example of FIG. 16, a "for" portion exists outside of a "fork-join" portion, so that every time the "for" loop is executed, each transaction will start concurrently to run the next "for" loop at the end of each sequence. Namely, a task, of which transaction is completed earlier, will hold starting of the next transaction until all other tasks complete their transactions.

In an example of FIG. 17, a "for" portion is allocated to each task within a "fork-join" portion. In this case, each task will start their first transactions concurrently but each task will repeat its loop by preset number. Namely, transaction of each task will be executed consecutively on and on regardless of the states of transactions of other tasks. In this case, the bus bridge 2 is required to process transactions from every direction without any pause. This enables to burden the bus bridge with more stresses than those experienced in actual operation.

Also, as described in an example of FIG. 18, it is possible to avoid transactions falling into a particular pattern by first generating random values at the beginning of each task and then starting transactions after waiting for cycles corresponding to the value. Further, as described in an example of FIG. 19, it is easy to delay start of transactions by one cycle consecutively using a "for loop" instead of waiting for random cycles. Also, Sweeping start of a transaction of a certain task against start of transaction of other tasks is easily achieved.

As stated above, without rewriting most portions of a test program but only slightly modifying the way to call each task, various situations or complex situations can be executed by a simulation.

According to embodiments above described it is possible to easily start transactions without complex setting by using master models and/or slave models in place of actually connected logic circuits. Also, it is possible to control starting time of transfer, so that checking under severer conditions than actually take place is made possible by causing complex situations which is not intended by a designer to occur.

Further, bugs in logic circuits can be detected earlier by checking situations not intended by a designer. Also, checking under severer conditions than actually take place would enable to find hidden bugs. This makes it possible to develop high quality functional blocks without bugs to eliminate occurrence of failures at the time of reuse of each functional block.

Especially, usage of bus function models in place of an actual CPU allows performing a simulation without software for CPU, enabling logic checking. Also, usage of bus function models in place of a DMA controller other than CPU allows omitting cumbersome setting inherent to a DMA controller to enable to occur similar transactions, allowing easy checking of operation. Also, even before a logic circuit is completed which should exist outside of the object to be checked, logic checking can be conducted by executing a simulation.

Tendency of bus transactions issued by an actual DMA controllers to fall into a certain particular pattern would reduce probability to develop complex situations but usage of active models enables to develop random transfer with no particular pattern, enhancing probability of development of complex situations not intended by a designer, allowing more accurate, more thorough checking.

Further, it is difficult to control by one cycle base in an actual DMA controller but an active model allows cycle-by-cycle control of issuance of transfer, enabling such sweep testing as transfers from a plurality of active models are delayed by one cycle to overlap each other. As it is possible to cause transfer to occur in any given cycle, concurrent transfer would be easily issued from a plurality of active models to enable to check complex situations. Also, by using slave models, response from slaves may be issued arbitrary or randomly, further enabling to check more complex situations.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for logic checking to check an arbitration of an arbiter that is connected to a bus to which at least two master models and at least one slave circuit are connected, wherein each of the at least two master models is set to output a same signal to the bus as a corresponding one of at least two master circuits, wherein at least one slave model is set to output a same signal to the bus as the at least one slave circuit, and wherein a bus master model executes bus access in accordance with a bus protocol, the method comprising:

an outputting step of outputting requests from the at least two master models to the arbiter in accordance with the bus protocol by starting transitions of signals at a same cycle time, and outputting the signal from the at least one slave model in response to the signals outputted by the at least two master models; and a checking step of checking the arbitration of the bus access by the arbiter in response to the signals output from the at least two master models and the at least one slave model.

2. The method according to claim 1, further comprising:

an activating step of activating the at least two master models at arbitrary times.

3. The method according to claim 1, wherein, in the outputting step, a plurality of bus master models output requests for bus access directly to the bus arbiter in respective states of concentrating and deconcentrating the requests.

4. The method according to claim 1, wherein the bus master model outputs a request for bus access without requiring any input data.

5. The method according to claim 1, wherein the bus master model can pause operation.

6. The method according to claim 1, wherein the bus master model corresponds to one of the at least two master circuits and outputs a request for bus access at a same frequency as a corresponding one of the at least two master circuits.

7. The method according to claim 1, wherein the bus master model corresponds to one of the at least two master circuits and outputs a request for bus access at a higher frequency than a corresponding one of the at least two master circuits.

8. The method according to claim 1, wherein, in the outputting step, a plurality of bus master models operate by independently setting operational conditions for each of the plurality of bus master models.

9. The method according to claim 1, wherein the bus master model and the at least two master circuits are used and connected to the bus.

10. The method according to claim 1, further comprising a connecting step of connecting the bus master model to the bus in place of one of the at least two master circuits.

11. The method according to claim 1, wherein, in the outputting step, the signals are output from the at least two master models and the at least one slave model at random times.

12. The method according to claim 1, wherein, in the outputting step, the at least one slave model responds to a request from one of the at least two master models after a passage of a random time period.

13. The method according to claim 1, wherein the at least two master models and the at least one slave model are connected directly to the bus.

* * * * *